United States Patent [19]

Hara et al.

[11] Patent Number: 5,066,996
[45] Date of Patent: Nov. 19, 1991

[54] CHANNELLESS GATE ARRAY WITH A SHARED BIPOLAR TRANSISTOR

[75] Inventors: Hiroyuki Hara, Tokyo; Yasuhiro Sugimoto; Tetsu Nagamatsu, both of Yokohama, all of Japan

[73] Assignee: Kabushiki Kaisha Toshiba, Kawasaki, Japan

[21] Appl. No.: 684,513

[22] Filed: Apr. 15, 1991

Related U.S. Application Data

[63] Continuation of Ser. No. 311,256, Feb. 16, 1989, abandoned.

[30] Foreign Application Priority Data

Feb. 19, 1988 [JP] Japan .................. 63-35171

[51] Int. Cl.$^5$ .................. H01L 27/02; H01L 27/10
[52] U.S. Cl. .................. 357/43; 357/45; 365/225.6
[58] Field of Search .................. 357/43, 45; 365/225.6

[56] References Cited

U.S. PATENT DOCUMENTS 4,651,190  3/1987  Suzuki et al. .................. 357/45
4,682,202  7/1987  Tanizawa .................. 357/43

FOREIGN PATENT DOCUMENTS 177944  10/1984  Japan .................. 357/43

Primary Examiner—Rolf Hille
Assistant Examiner—Robert P. Limanek
Attorney, Agent, or Firm—Finnegan, Henderson, Farabow, Garrett, and Dunner

[57] ABSTRACT

A semiconductor device is disclosed having a channelless gate array. A plurality of standard cells are formed on a gate array chip such that one of the standard cells is formed relative to the adjacent standard cell with a bipolar transistor and resistor shared, as a BiCMOS logic gate, by the mutually adjacent standard cells at one end.

5 Claims, 7 Drawing Sheets

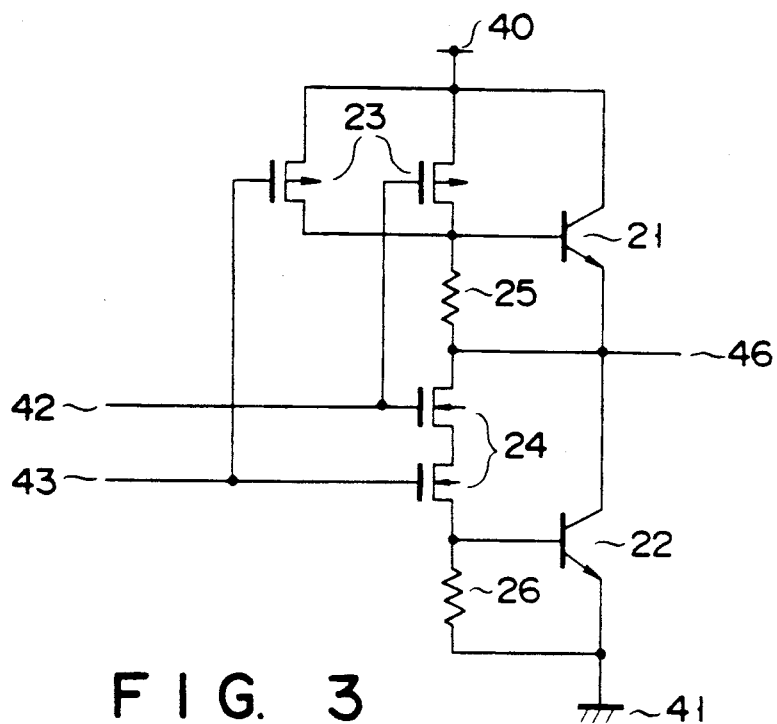
F I G. 3
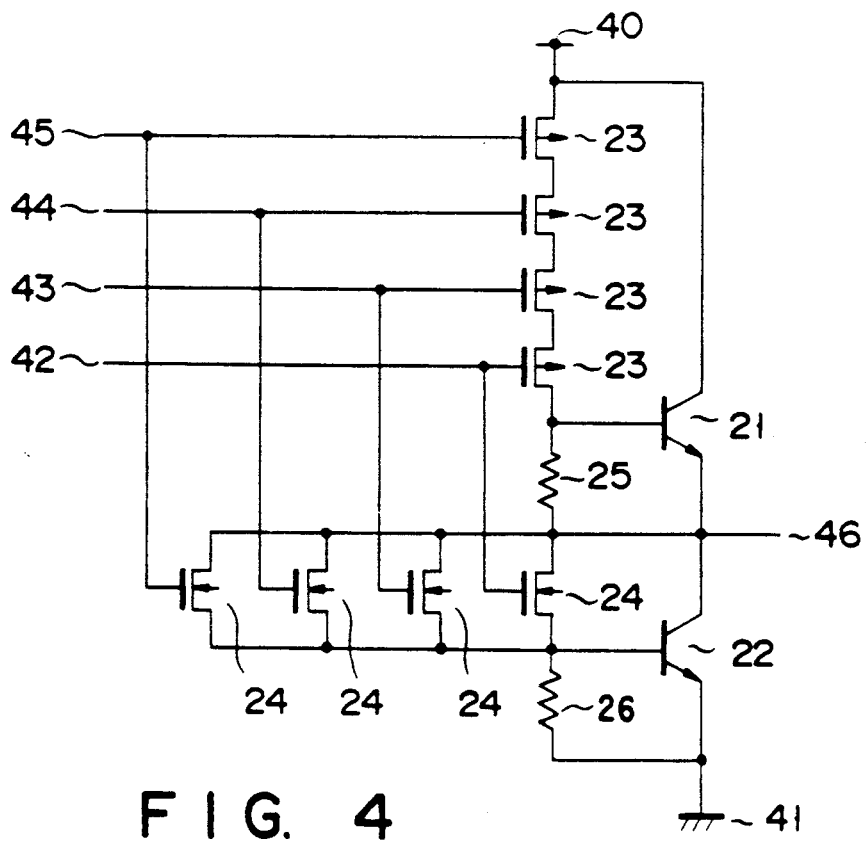
F I G. 4

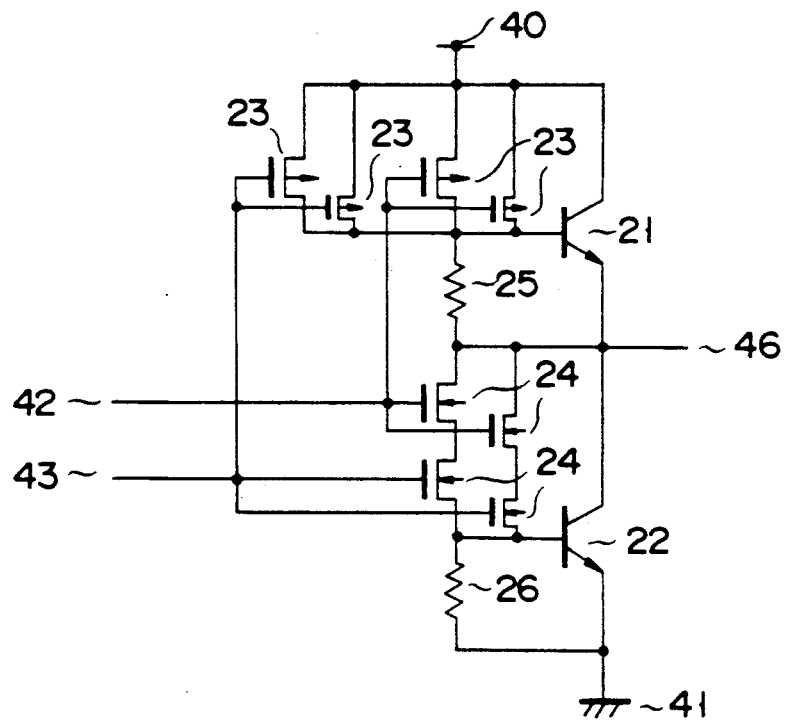
F I G. 10
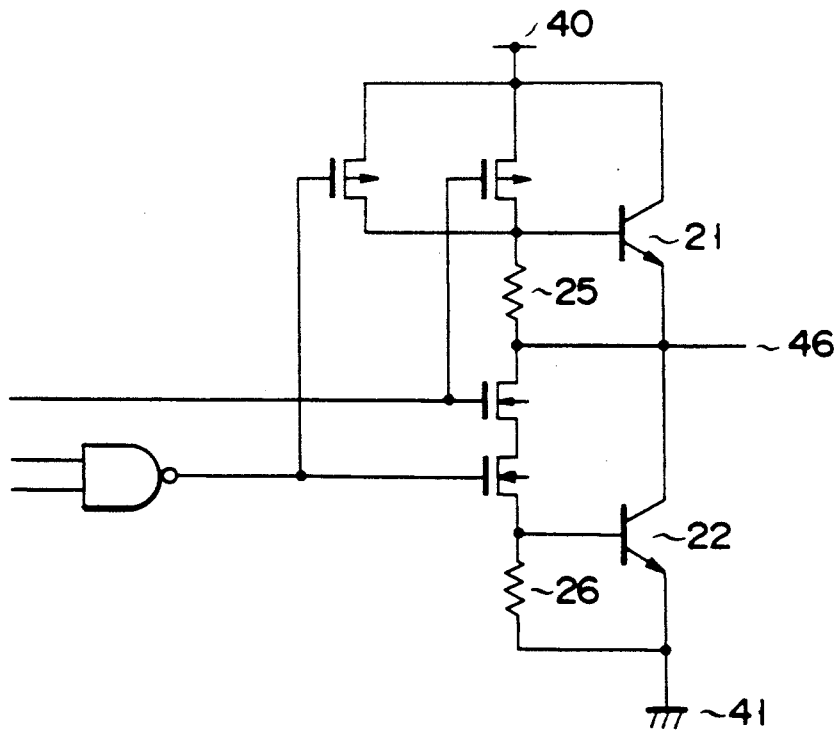
F I G. 11

CHANNELLESS GATE ARRAY WITH A SHARED BIPOLAR TRANSISTOR

This application is a continuation of application Ser. No. 07/311,256, filed 02/16/89, now abandoned.

BACKGROUND OF THE INVENTION

1. Field of the Invention

The present invention relates to a semiconductor device of a channelless gate array type having CMOS and biopolar transistors regularly formed on a common chip.

2. Description of the Related Art

FIG. 1 shows a standard cell array as a BiCMOS gate array as disclosed in Japanese Patent Disclosure (KOKAI) No. 60-16575 and FIG. 2 shows a detailed arrangement of a standard cell of the BiCMOS gate array of the Japanese KOKAI as set forth above.

In FIGS. 1 and 2, reference numeral 10 shows a gate array chip; 11, a standard cell; 12, standard cell rows; 13, a wiring layer; 14, an input/output circuit formation area and bonding pad formation area; 21, 22, bipolar transistors; 23, a PMOS transistor; 24, an NMOS transistor; and 25, 26, resistors The BiCMOS gate arrangement shown in FIG. 2 contains two PMOS transistors, two NMOS transistors 24 as well as two bipolar transistors and two resistors relative to these P and N transistors. A whole layout of the gate array chip 10 comprises a standard cell array and wiring layers 13 each formed between the cell rows. The resistors 25 and 26 as shown in FIG. 2 are of a diffusion type having a fixed resistive value In the conventional array pattern system as shown in FIG. 2, two bipolar transistors are contained in the standard cell 11, increasing the chip size and extending a wiring layer length for gate-to-gate connection. As a result, a load capacity involved is increased, failing to obtain a high-speed feature which is one object of the BiCMOS gate. At the area of a samller load capacity, such as a shorter gate-to-gate wiring layer length area at a wiring pattern in the chip or an area where less number of gates are connected, the CMOS gate operates at a higher speed than the BiCMOS gate. It is at a relatively great load capacity area that a high-speed operation is achieved by the BiCMOS gate. It is, therefore, unnecessary to employ BiCMOS gates for all of the logic gates involved; that is, it is thus possible to employ CMOS gates in place of some BiCMOS gates. In spite of this situation, an excess number of bipolar transistors as used in the conventional array pattern system.

If, in the formation of a two-input BiCMOS NAND gate on a gate array chip as shown in FIG. 3 and a four input BiCMOS NOR gate on a gate array chip as shown in FIG. 4, the resistive value of the resistor 25 or 26 is made constant irrespective of the types of the logic gates, either one of the logic gates decreases in operation speed and increases in dissipation power. In FIGS. 3 and 4, reference numeral, 42 to 45 show input terminals; 46, an output terminal; 40, a power supply terminal (a positive voltage in this case) and 41, a ground terminal, noting that the circuit as shown in these Figures is of a pseudo ECL logic gate type. In FIG. 4, the four transistors 23 are connected in series with each other in which case the series resistance becomes greater than as shown in FIG. 3. Given that the resistive value of the resistor 25 is set equal in the circuit as shown in FIGS. 3 and 4, the base current of the transistor 21 becomes smaller in the circuit of FIG. 4 than in the circuit of FIG. 3 and the operation speed of the transistor 21 is delayed in the circuit of FIG. 4 upon comparison with that in the circuit of FIG. 3. In order to increase the operation speed in the circuit of FIG. 4, it will be necessary to make the resistive value of the resistor 25 greater than that in the circuit shown in FIG. 3. Furthermore, if the resistive values of the resistors 25 and 26 are not proper, the dissipation current of the respective logic gate cannot be held at a proper level.

SUMMARY OF THE INVENTION

An object of the present invention is to provide a semiconductor device having a channelless gate array, in which a plurality of standard cells are formed such that one of the standard cells is arranged relative to the adjacent standard cell with one of two bipolar transistors in the standard cell shared by the adjacent standard cell at one end to provide a BiCMOS gate array.

Another object of the present invention is to provide a semiconductor device in which a plurality of standard cells are formed such that one of the standard cells is arranged relative to the adjacent standard cell with one bipolar transistor and at least one resistor in the standard cell shared by the adjacent standard cell at one end to provide a channelless gate array, and a plurality of standard cell rows are arranged such that no spacing is left between the mutually adjacent standard cell rows.

According to the present invention, in order to minimize the number of bipolar transistors required by arranging standard cell rows relative to the adjacent standard cell row so that no spacing is left between the mutually adjacent standard cell rows, the standard cell row is arranged such that one bipolar transistor of the standard cell is shared by the adjacent standard cell at one end. It is thus possible, according to the present invention, to halve the number of bipolar transistors in comparison with a conventional semiconductor device and hence to decrease the size of the chip accordingly. Since a BiCMOS gate can be formed at a location of a heavier load capacity, a "high-speed" feature can be maintained in comparison with the "sea of gate arrays".

The value of a resistor or resistors can be varied depending upon the types of logic gates required. It is thus possible to avoid a drop in operation speed and a degradation in dissipation power.

According to the present invention, as set forth above, a bipolar transistor necessary to construct a BiCMOS logic gate with standard cells can be shared by mutually adjacent standard cells at one end to provide a channelless gate array. By so doing, it is possible to optimize the number of bipolar transistors required and hence to decreases the size of the chip in comparison with a conventional semiconductor device. Since the channelless gate array is adopted, according to the present invention, to large-scale cell, such as a memory and shift register, which have a predetermined functions of can efficiently be incorporated into a semiconductor device to provide a gate array of larger capacity. Furthermore, in order to implement a BiCMOS logic gate, a resistive value can be set to a proper value for each logic gate, thus avoiding a drop in the operation speed and in an increase the dissipation power.

BRIEF DESCRIPTION OF THE DRAWINGS

FIG. 3 is a circuit diagram showing a two-input BiCMOS NAND gate;

FIG. 4 is a circuit diagram showing a four-input BiCMOS NOR gate;

FIG. 10 is a circuit diagram showing four P- and four N-type MOS transistors in a standard cell. The gate width of the two P- and N-type MOS transistors is made double with the use of those two P- and two N-type MOS transistors which are not used in the two-input BiCMOS NAND gate shown in FIG. 8; and FIG. 11 is circuit diagram showing a combination of the two-input BiMOS NAND gate with a CMOS logic gate constructed using two P- and two N-type MOS transistors which are not employed in the two-input BiCMOS NAND gate shown in FIG. 8.

DETAILED DESCRIPTION OF THE PREFERRED EMBODIMENTS

A semiconductor device according to an embodiment of the present invention will be explained below by referring to the accompanying drawings.

Figure 1:
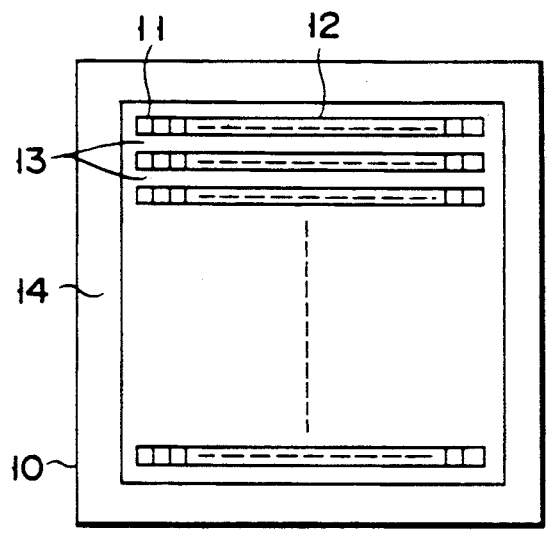
FIG. 1 shows a whole pattern diagram of a conventional gate array.
Figure 2:
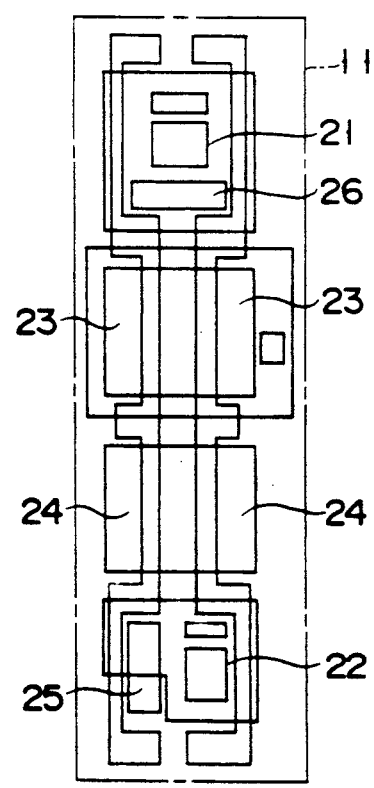
FIG. 2 is a detailed view showing one standard cell as shown in FIG. 1.
Figure 5:
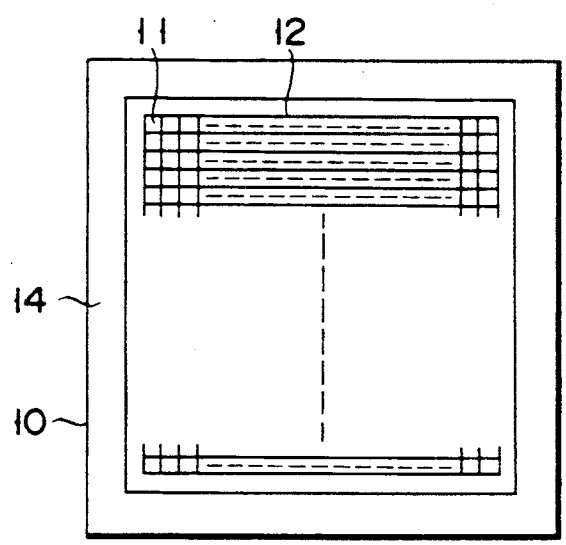
FIG. 5 shows a whole pattern diagram showing a gate array of the present invention.
Figure 6:
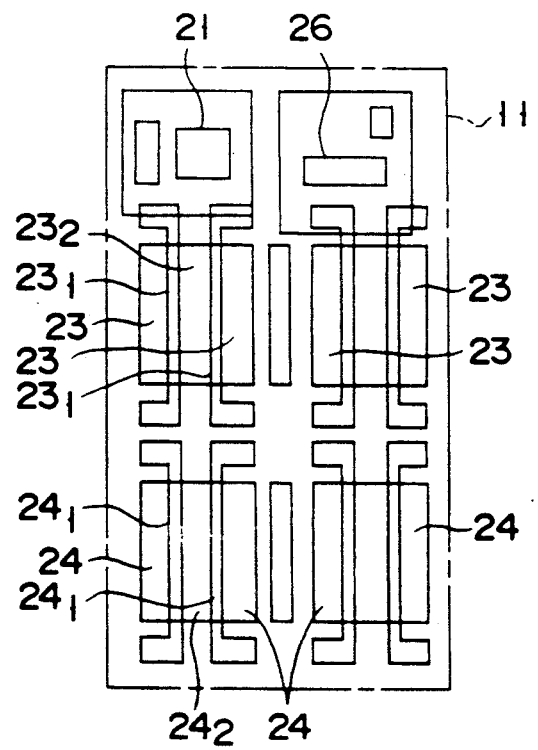
FIG. 6 shows a detailed pattern diagram showing one of standard cells in the gate array shown in FIG. 5.
Figure 7:
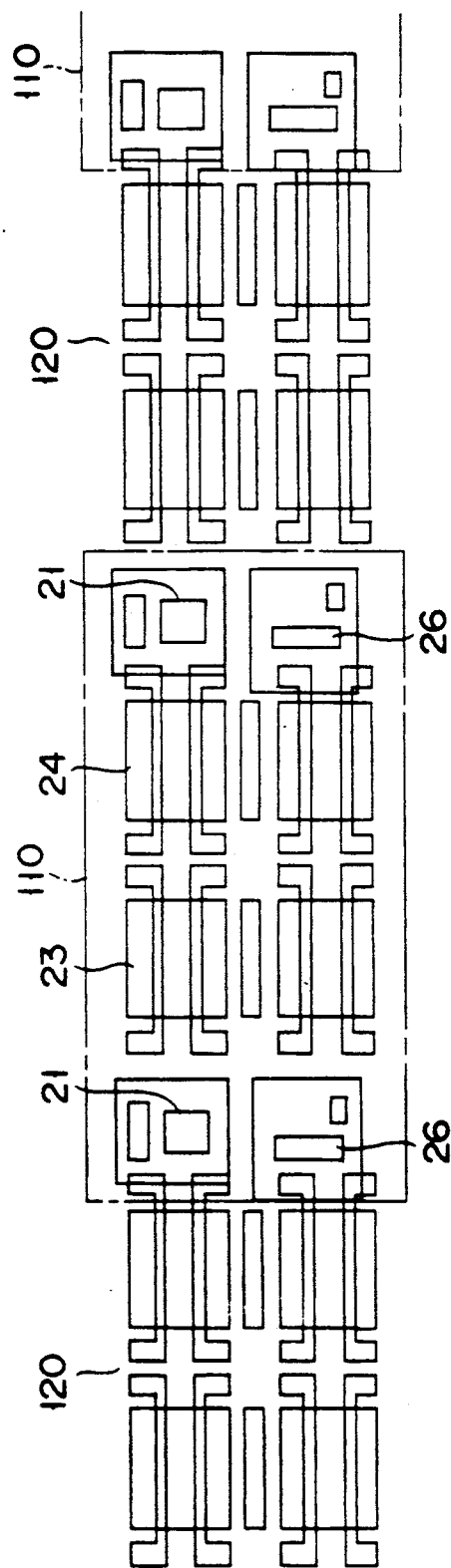
FIG. 7 is a pattern diagram showing a BiCMOS logic gate using a bipolar transistor shared between a standard cell and an adjacent standard cell at one end.

FIG. 5 shows a whole pattern diagram of a gate array according to the embodiment of the present invention. FIG. 6 is a plan view showing a single standard cell 11 in the gate array shown in FIG. 5. In FIGS. 5 and 6, the same reference numerals are employed to designate parts or elements corresponding to those shown in FIGS. 1 and 2. In FIG. 6, 23 and 24 show gates; 23$_2$, a common source or drain of the gates 23; 24$_2$, and a common source or drain of the gates 24. A standard cell 11 as shown in FIG. 6 includes four PMOS transistors 23, four NMOS transistors, one bipolar transistor 21 and one resistor 26. The standard cells 11 as shown in FIG. 6 are arranged on a gate array chip 10 with no wiring layer 13 formed between the standard cell rows. Input-/output circuit formation area and bonding pad formation area 14 is formed around the standard cell array pattern. FIG. 7 is a plan view showing a pattern concept when a BiCMOS logic gate is constructed using the standard cells 11 as shown in FIG. 7. That is, FIG. 7 is an enlarged view showing a standard cell row shown in FIG. 5. Upon the formation of the BiCMOS logic gate the standard cell is formed relative to the adjacent standard cell with one bipolar transistor 21 and resistor 26 of the standard cell shared by the adjacent standard cell at one end to provide a BiCMOS logic gate 110. In the arrangement of the BiCMOS logic gate as shown in FIG. 7, it is possible to construct four-input BiCMOS NAND gate or four-input BiCMOS NOR gate at least in one standard cell. The two adjacent CMOS transistors are located each relative to the BiCMOS logic gate 110 in which case a layer overlying the CMOS transistor 120 is used as a wiring layer. Furthermore, if the gate 110 is being used as the CMOS logic gate and not as the BiCMOS logic gate, a layer overlying the bipolar transistor in the gate 110 can be used as a wiring area. If a large-sized circuit unit, such as a memory, is built in the semiconductor device, the layer overlying the CMOS transistor 120 can be used as the logic gate and it is thus possible to construct a high-integration density BiCMOS gate array with a short layout wiring layer. Although, in the circuit shown in FIG. 7, use has been made of the shared bipolar transistor between the BiCMOS logic gate 110 and the adjacent CMOS transistor 120 in a lateral array, a bipolar transistor may be employed which is located in a vertically adjacent array.

Figure 8:
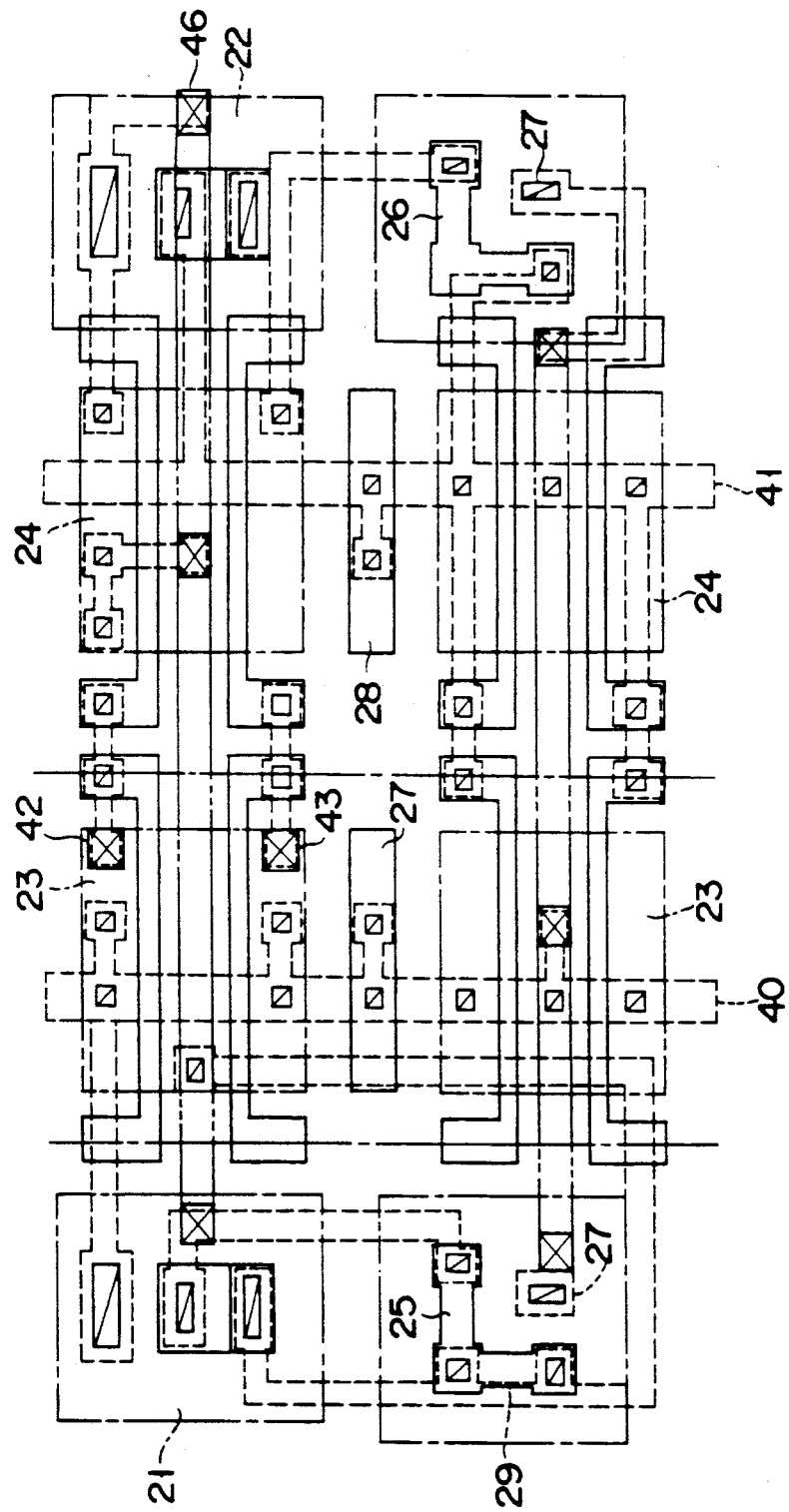
FIG. 8 shows a pattern diagram showing a two-input BiCMOS NAND gate using the pattern shown in FIG. 7.

FIG. 8 is a circuit arrangement corresponding to the two-input BiCMOS NAND gate shown in FIG. 3 in which case the resistive value of the resistors 25 and 26 is set to a proper value for the two-input BiCMOS NAND gate. FIG. 8 is a plan view showing an IC pattern of a semiconductor device according to the embodiment of the present invention. In FIG. 8, reference numeral 27 shows a well contact and 28 a sub-contact. The resistive value of the resistors 25 and 26 can be adjusted to a proper level to perform their own operations as set out below. By so doing, in the two-input BiCMOS NOR logic gate the resistor 25, if being lower in its level, can decrease a dissipation power at a substantially constant operation speed. On the other hand, the resistor 26, if being higher in its level, reveals a constant dissipation power at an increased operation speed. In the arrangement shown in FIG. 8, the resistor 25 is of an inverted-L configuration with a longitudinal section grounded by an Al wiring layer 29. For this reason, the resistor 25 is employed such that only a lateral section of the inverted-L resistor 25 serves as a resistor.

Figure 9:
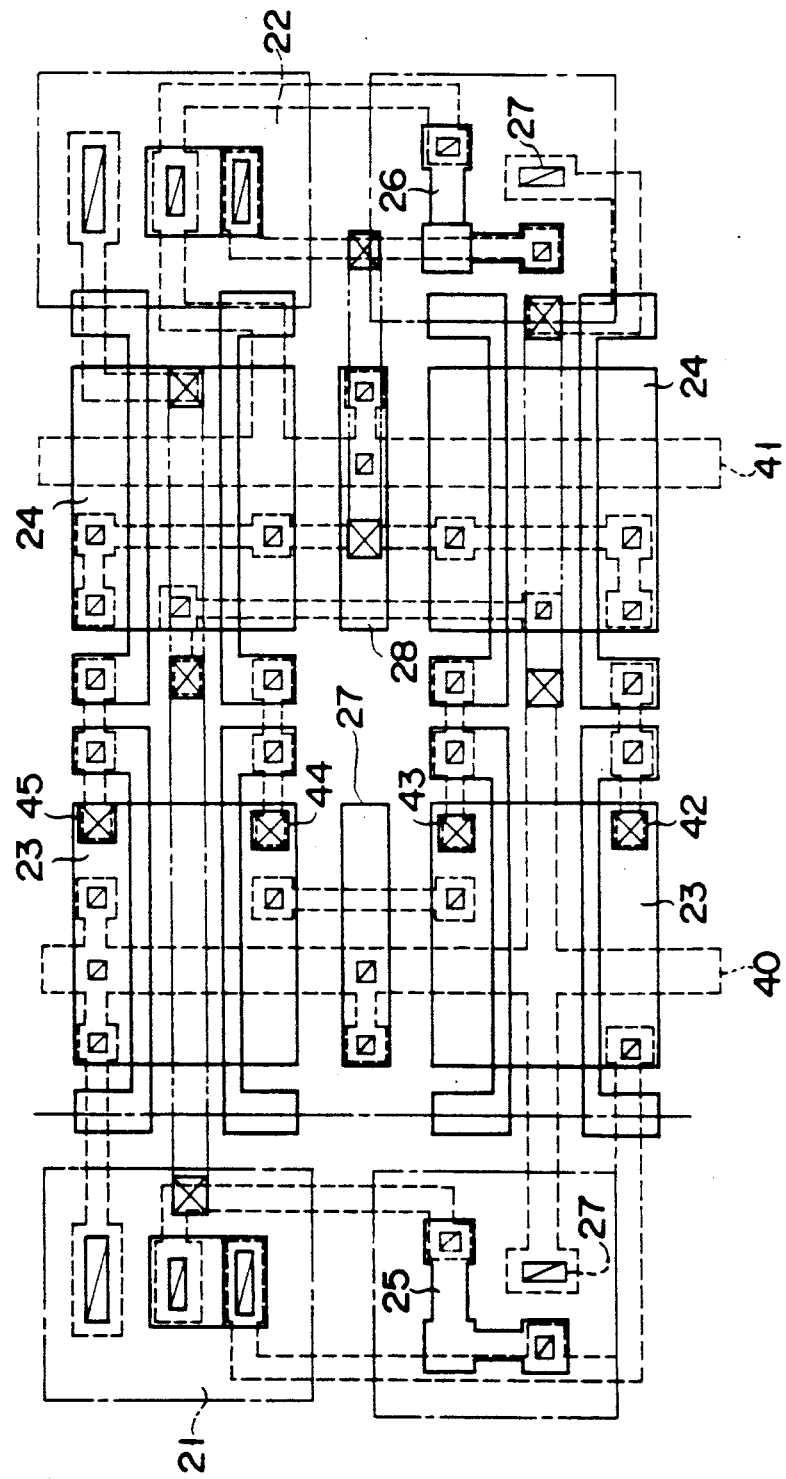
FIG. 9 is a pattern diagram showing a four-input BiCMOS NOR gate using the pattern shown in FIG. 7.

FIG. 9 shows an IC pattern corresponding to a circuit arrangement of the four-input BiCMOS NOR gate in which case the resistive value of the resistors 25 and 26 is set to a level suitable for the four-input BiCMOS NOR gate. In the semiconductor device shown in FIG. 9, the resistor, if being lower in its level, reveals a very low operation speed. Therefore, the four-input BiCMOS NOR gate obtains no suitable characteristic, if use is made of a resistor whose resistive value is the same as that of the two-input BiCMOS NAND gate, and can achieve a proper operation speed and proper dissipation power by setting the resistor's value to a proper level different from that of the two-input BiCMOS NAND gate. In the circuit pattern shown in FIG. 9, both the lateral and longitudinal sections of the inverted-L resistor are used as the resistor 25 which is higher in its level than the corresponding resistor of the two-input BiCMOS NAND gate. If two P- and two N-type MOS transistors which are not used in the two-input BiCMOS NAND gate as shown in FIG. 8 are connected as shown in FIG. 3 and further as shown in FIG. 10 to double the gate width of those two P- and two N-type MOS transistors which are employed in the BiCMOS NAND gate, then it is possible to obtain a two-input BiCMOS NAND gate as a speeded-up type unit. It is also possible that these MOS transistors not employed in the two-input BiCMOS NAND gate of FIG. 8 are combined, as a CMOS logic gate, with the two-input BiCMOS NAND logic gate as shown in FIG. 11.

Various changes or modifications of the present invention may be made without departing from the spirit and scope of the present invention and, in this sense, the present invention should not be restricted to the aforementioned embodiments only. For example, from the standpoint of adjusting the value of resistors in the standard cell, a plurality of resistors may be formed within the standard cell so that their resistive value is adjusted in a various mode of connection. Furthermore, the bipolar transistor, resistors and PMOS transistors may be formed within their own wells or two (the resistor and PMOS transistor for instance) or three (the resistor, PMOS transistor and bipolar transistor) circuit elements may be formed in a common well.

What is claimed is:

1. A semiconductor device having a channelless gate array, comprising:

a gate array chip; and a plurality of standard cell rows disposed on said gate array chip such that no space exists between adjacent standard cell rows; each of said plurality of standard cell rows including a plurality of adjacent standard cells; each of said plurality of standard cells including a plurality of P-type and N-type MOS transistors, one bipolar transistor and one or more resistors; wherein said one bipolar transistor and said one or more resistors of each standard cell are shared by an adjacent standard cell to provide BiCMOS logic gates in each of said plurality of standard cell rows.

2. The semiconductor device according to claim 1, wherein each BiCMOS logic gate includes a two-input BiCMOS NAND gate, wherein the lengths of said one or more resistors shared between adjacent standard cells are varied to provide a proper resistive value suitable for each BiCMOS NAND gate.

3. The semiconductor device according to claim 1, wherein said plurality of P-type and N-type MOS transistors include four P-type MOS transistors and four N-type MOS transistors.

4. The semiconductor device according to claim 1, wherein each BiCMOS logic gate includes two-input BiCMOS NAND gates and four P-type and four N-type MOS transistors formed on said standard cells.

5. The semiconductor device according to claim 1, wherein each BiCMOS logic gate includes a fur-input BiCMOS NOR gate, wherein the lengths of said one or more resistors shared between adjacent standard cells are varied to provide a proper resistive value suitable for each BiCMOS NOR gate.

* * * * *

UNITED STATES PATENT AND TRADEMARK OFFICE
CERTIFICATE OF CORRECTION

PATENT NO. : 5,066,996
DATED      : November 19, 1991
INVENTOR(S) : Hiroyuki HARA et al.

It is certified that error appears in the above-identified patent and that said Letters Patent is hereby corrected as shown below:

Claim 5, column 6, line 19, change "fur-input" to --four-input--.

Signed and Sealed this

Tenth Day of August, 1993

Attest:

MICHAEL K. KIRK

Attesting Officer     Acting Commissioner of Patents and Trademarks